United States Patent
Cuevas

(10) Patent No.: US 7,405,573 B2
(45) Date of Patent: Jul. 29, 2008

(54) ELECTRICAL CONNECTOR FOR SEMICONDUCTOR DEVICE TEST FIXTURE AND TEST ASSEMBLY

(75) Inventor: Peter P. Cuevas, Los Gatos, CA (US)

(73) Assignee: QualiTau, Inc., Santa Clara, CA (US)

( * ) Notice: Subject to any disclaimer, the term of this patent is extended or adjusted under 35 U.S.C. 154(b) by 0 days.

(21) Appl. No.: 10/598,825

(22) PCT Filed: Mar. 16, 2005

(86) PCT No.: PCT/US2005/008892

§ 371 (c)(1),
(2), (4) Date: Sep. 12, 2006

(87) PCT Pub. No.: WO2005/089421

PCT Pub. Date: Sep. 29, 2005

(65) Prior Publication Data

US 2007/0190823 A1    Aug. 16, 2007

(51) Int. Cl.
*G01R 31/02* (2006.01)
(52) U.S. Cl. .................. 324/539; 324/158.1; 439/78
(58) Field of Classification Search ............... 324/539, 324/158.1; 439/75, 79, 78
See application file for complete search history.

(56) References Cited

U.S. PATENT DOCUMENTS

| | | |
|---|---|---|
| 4,671,593 A | 6/1987 | Millon-Fermillon et al. |
| 4,917,613 A | 4/1990 | Kabadi |
| 5,144,098 A | 9/1992 | VanDeusen |
| 5,417,593 A | 5/1995 | Suzuki et al. |
| 5,647,765 A | 7/1997 | Haas et al. |
| 6,373,255 B2 | 4/2002 | Tury et al. |
| 6,462,570 B1 | 10/2002 | Price et al. |
| 6,507,205 B1 | 1/2003 | Dibish et al. |
| 2003/0082936 A1* | 5/2003 | Goto et al. ............... 439/75 |
| 2005/0148218 A1* | 7/2005 | Fang et al. ............... 439/79 |

OTHER PUBLICATIONS

EP Search Report in corresponding EP application 05730791.0 mailed Feb. 19, 2008.
Search Report in corresponding Singaporean application No. 20060637-3, mailed May 22, 2008.
Written Opinion in corresonding Singaporean application No. 200606371-3, mailed May 22, 2008.

* cited by examiner

*Primary Examiner*—Vincent Q Nguyen
(74) *Attorney, Agent, or Firm*—Beyer Law Group LLP

(57) ABSTRACT

An interconnect assembly is for use in connection with a semiconductor device under test (DUT) having a plurality of leads to electronic test equipment. The interconnect assembly includes a cable including a plurality of wires with at least one wire for sensing a signal from a DUT, at least one wire for a forcing signal to the DUTY and at least one wire for a guarding signal driven by the same electrical potential as the forcing signal. A male connector includes the plurality of wires, an outer metal coating surrounding the plurality of wires, and an insulating coating around the outer metal coating. A receptacle connector is for receiving the male connector and plurality of wires with corresponding contacts.

10 Claims, 4 Drawing Sheets

ELECTRICAL CONNECTOR FOR SEMICONDUCTOR DEVICE TEST FIXTURE AND TEST ASSEMBLY

BACKGROUND

The electric wires connecting between the Device(s) Under-Test (DUT(s)) and the electronic equipment, which delivers the various electrical stimuli to the DUTs and measure them accordingly, require special attention, in particular when very sensitive devices are involved. Since the DUTs are commonly placed on a special fixture (hereinafter "Test Fixture"), these connecting wires may develop non-negligible Ohmic voltage drop due to the flowing current, as well as leakage to their surroundings. The stringent demands from state-of-the-art electronic device testing, in terms of accuracy, sensitivity and low-leakage current, over a wide range of current and voltage levels, make such connectivity issues both important and challenging.

The most common approach to address these concerns is by using two tri-axial cables (hereinafter "Triax") per each electronic stimulus, where both sensing the true voltage on the device nodes and minimizing the leakage are important issues. For One of the two cables, the center conductor is the forcing signal, the surrounding cylindrical conducting shell is the guarding signal ("Guard"), driven by the same potential as the forcing signal, but insulated both electrically and physically from it. Finally, the outer metal shell is usually connected to ground potential for safety and also shields from outside noise. Similarly, the center conductor of the second Triax delivers the signal sensed at the device node to the measurement unit, with a similar guarding scheme and outer metal shell. Since the force and sense lines are fully enclosed by their surrounding Guards, all with almost the same potential, the leakage is reduced significantly. Also, connecting the sense line to the DUT assures measurement of the required voltage at the DUT, rather than the forcing signal, possibly affected by Ohmic losses along its connecting line. In other words, the testing instrumentation (hereinafter, the "Tester") that the Force and Sense lines come from can use the Sense Signal to adjust the Force signal accordingly, and verify that the signal at the DUT end is indeed of proper value.

As this technique is well known and documented in the prior art (for example. Agilent Technologies 4155B/4156B Semiconductor Parameter Analyzer User's Guide General Information, page 2-38), it is obviously beyond the scope of this application. However, even with such two-Triax approach, there is a problem with the final connection within the Test Fixture. As each Triax terminates with a respective connector on the Test Fixture, the final electrical link from this connector to the DUT is implemented with simple wires due to physical constraints (see FIG. 1). Furthermore, to facilitate connectivity to every possible pin of the DUT, a "jumper matrix", made of plug-in wires linking the signals and their intended destination, is needed. In all, the guarding scheme is practically broken at the connectors that terminate the Triax cables at the Test Fixture and not as close as possible to the DUT. Another problem with the two-Triax scheme is that the Force and Sense lines have to be individually "jumpered" one at a time to the same node. If, by chance, a mistake is made and the Force lines goes to one node of the DUT while the Sense lines goes to another, then that would break the key feedback loop and may cause a voltage on the DUT far different from what was intended. The possibility this error is heightened during tests that require the use of multiple Tester's. (FIG. 2)

The following invention provides a solution to this problem, by different cables, well suited for such task, and an overall simplification of the connectivity scheme. It also introduces a new test fixture mounted as a rotating tray, which can serve as front cover to the electronic equipment as needed. This eliminates the long Triax cables and the separate and remote Test Fixture altogether, while still providing the improved connectivity scheme of the invention.

SUMMARY

An interconnect assembly is for use in connection with a semiconductor device under test (DUT) having a plurality of leads to electronic test equipment. The interconnect assembly includes a cable including a plurality of wires with at least one wire for sensing a signal from a DUT, at least one wire for a forcing signal to the DUTY and at least one wire for a guarding signal driven by the same electrical potential as the forcing signal. A male connector includes the plurality of wires, an outer metal coating surrounding the plurality of wires, and an insulating coating around the outer metal coating. A receptacle connector is for receiving the male connector and plurality of wires with corresponding contacts.

DETAILED DESCRIPTION

Figure 1:
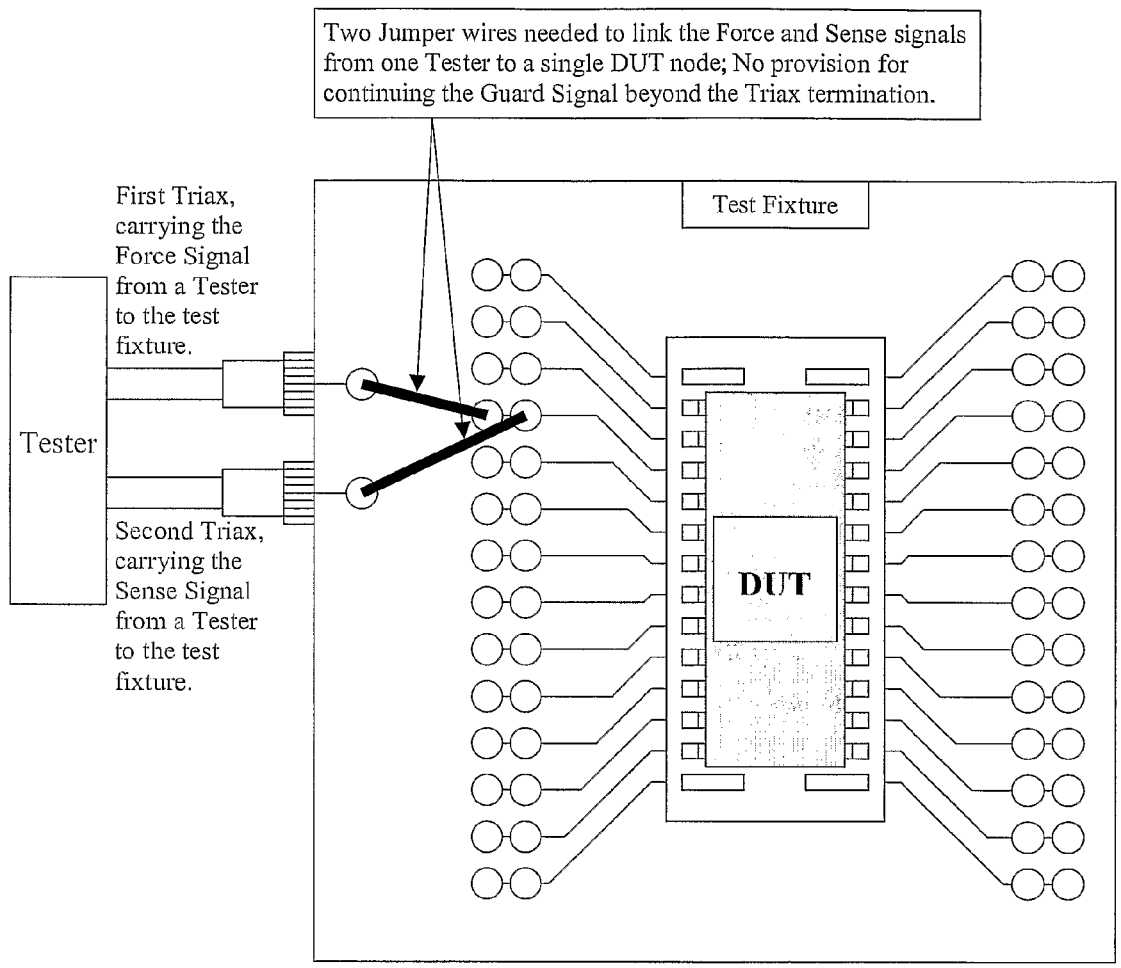
FIG. 1 illustrates a conventional configuration to connect a DUT and a test fixture.
Figure 2:
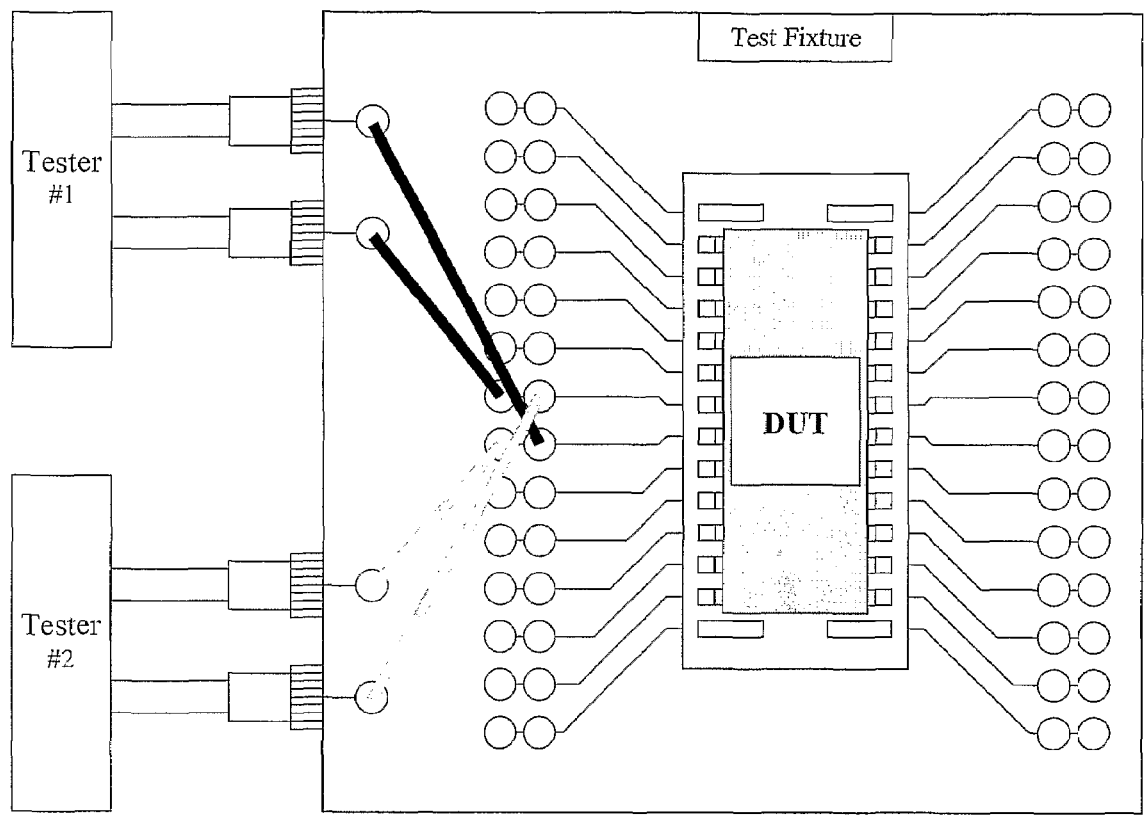
FIG. 2 illustrates an example of a possible mistake in jumper wire placement in the FIG. 1 configuration with multiple test fixtures.
Figure 3:
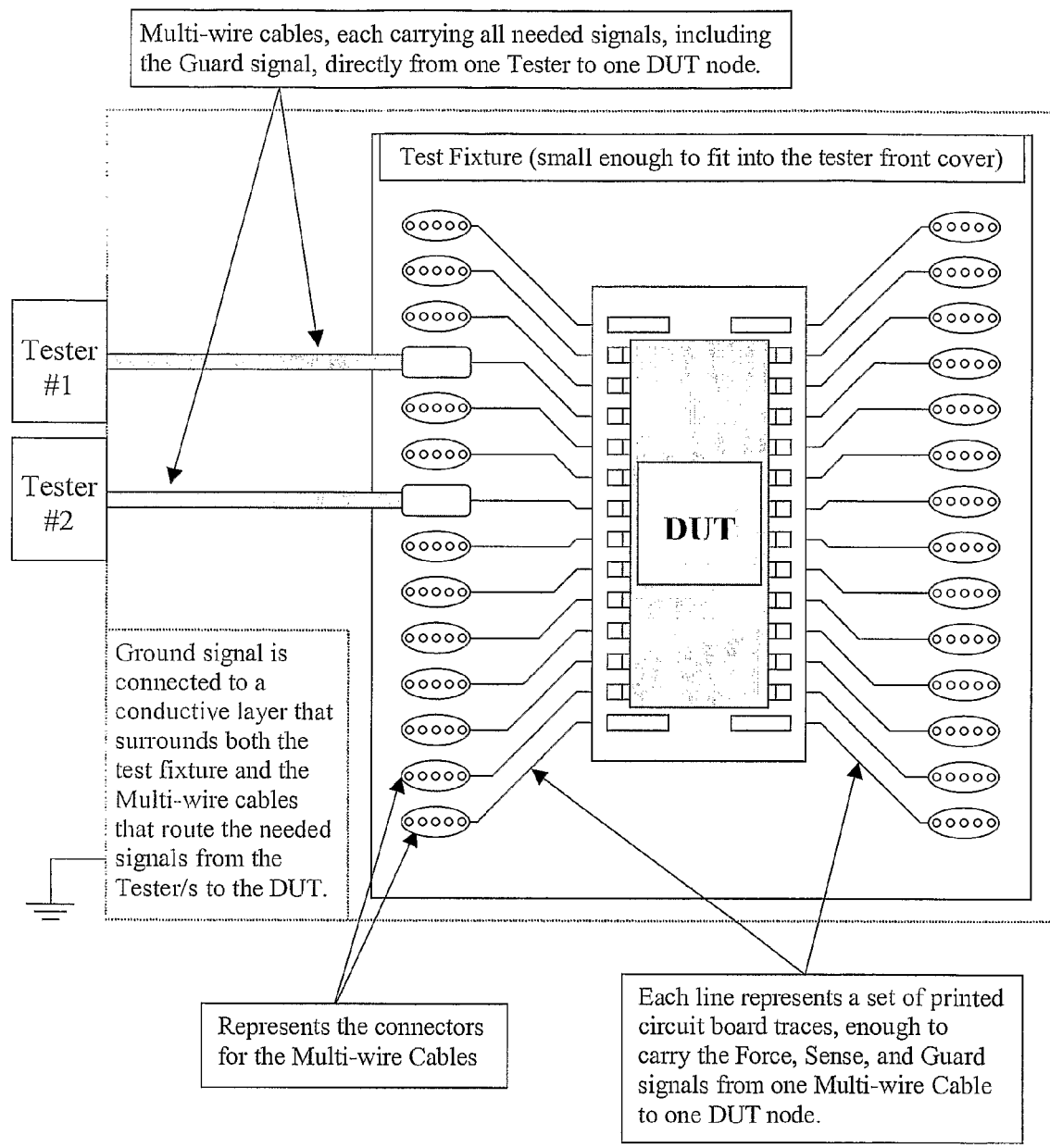
FIG. 3 illustrates an embodiment of the present invention showing a configuration wherein miniature cables are used to carry at least three critical signals.

The first element in the current invention (FIG. 3) is the use of miniature cables that can carry at least the three critical signals, namely the Force, Sense, and Guard signals, in one cable instead of the two bulky Triax cables. The specific cables chosen by us are mini-USB cables, very common in computer related applications. These flexible, relatively cheap, readily available and physically small cables possess excellent insulation characteristics. Each cable contains five inner wires, all surrounded by a metallic enclosure. The five inner-wires are used as follows: One wire for Sense, one wire for Guard and the remaining three wires for Force. Note that three wires are allocated for the force signal to maximize its current carrying capability; however, any combination which assures at least one dedicated wire to each of the three functions (namely, Force, Sense, Guard) is applicable and should be considered an integral part of this invention. Another related provision addresses safe handling: The outer coating along the entire USB cable is made of flexible insulator. Its only exposed part is the terminating edge, which requires plug-in connection to a mating connector in the Test Fixture, and in the opposite end to the electronic equipment via similar connector. Since these cable edges are exposed to allow good electrical contact between the outer metal and the mating connector's frame, the user may be exposed to the voltage at this outer metal before the cable is plugged into its mating connector (once plugged, everything is insulated). As the outer metal provides good noise protection and prevents leakage when used as Guard, connecting it to the Guard signal is desirable, so this safety issue must be properly addressed. Note that the specific selection of the USB cable is just one embodiment, as any other cable with sufficient number of wires, surrounding metal guard, low-leakage and sufficiently small cross section is appropriate. Therefore, the invention should include such cable as another embodiment of the underlying idea and concept.

The outer metal is not connected to any signal as long as the cable is not plugged into the Test Fixture. Once plugged, an internal connection on the insulated printed circuit board of the Test Fixture effectively shorts the dedicated inner wire of the USB cable, carrying the Guard signal, to the outer metal. This way, only when the cable is fully plugged and the user is not exposed to its conductive parts, the outer metal is connected to the Guard signal as required.

The Ground signal is routed to the test fixture through a separate path that connects to a conductive layer that surrounds the test fixture.

Since the USB cable is small and its connector presents such a small footprint, it is possible to connect as many cables as needed for practical testing and well beyond that (28, for example, with straightforward expansion to 40). This eliminates the need for jumper wires to route the signals from the Triax to the DUT. Furthermore, a single printed circuit delivers each and every signal to its intended DUT pin with fully guarded lines, all the way to the DUT(s).

Also, since a single cable contains both the Force and Sense lines, it is impossible to make the mistake of unintentionally connecting the two aforementioned lines to different nodes.

Figure 4A:
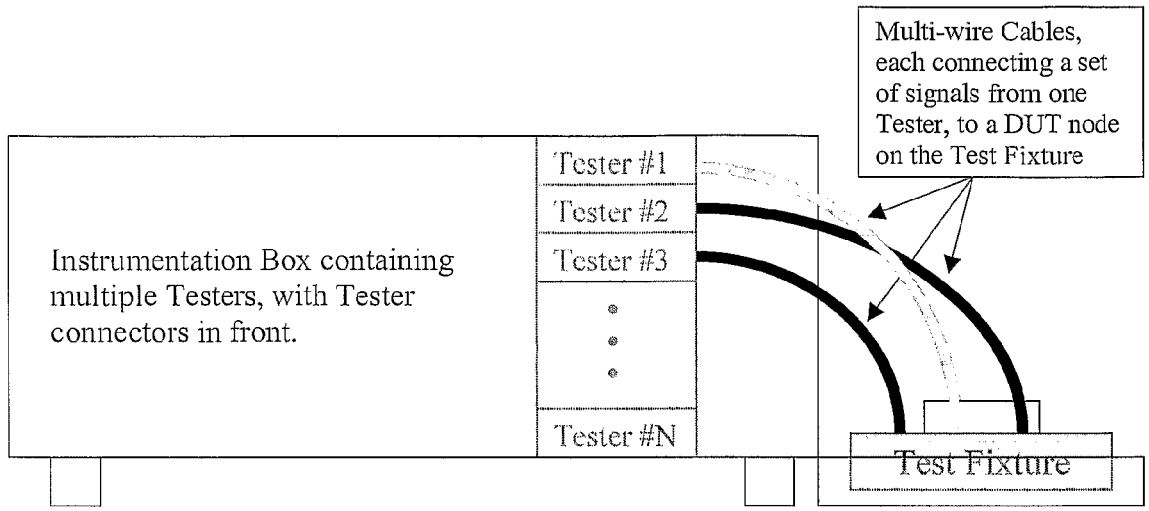
FIG. 4A is a cross section diagram of a test fixture in accordance with and embodiment of the invention, showing the front cover (with built-in test fixture) open.
Figure 4B:
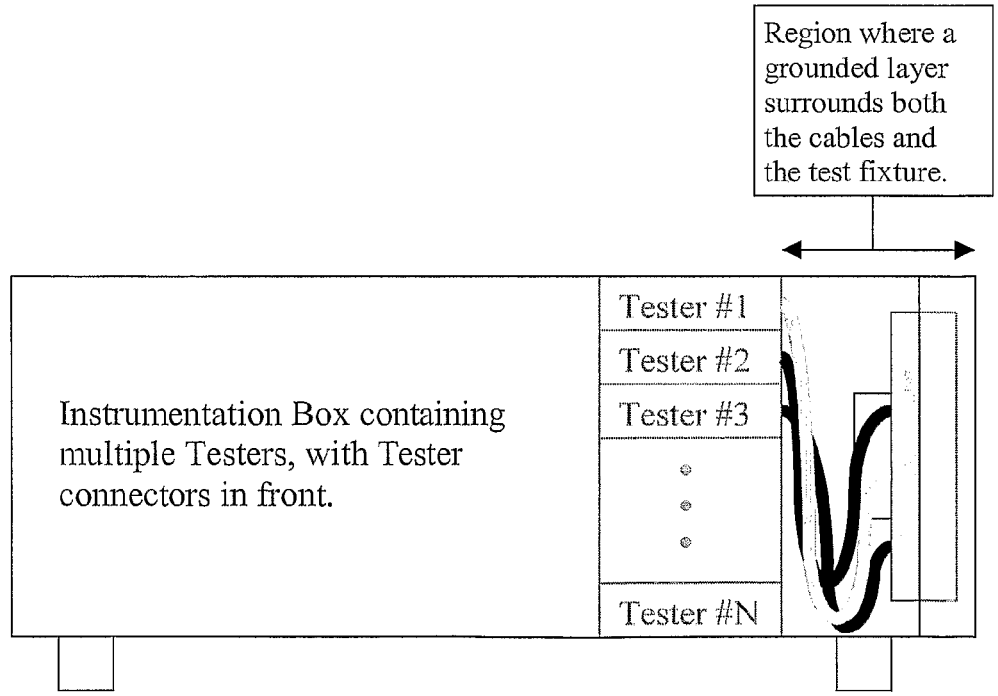
FIG. 4B is a cross section diagram of the FIG. 4A test fixture, showing the front cover (with built-in test fixture) closed.

Finally, with the simplifications described above, a novel Test Fixture is added as part of this invention. A cover to the front panel is modified to house a complete Test Fixture, with the USB cables connecting directly between the electronic box (its front panel) and the Test Fixture. This eliminates the Triax cables altogether, reduces the length of any connecting cable significantly and allows, by a handy rotation scheme, testing while the Front Cover is open (Test Fixture perpendicular to the front panel) or closed (Test Fixture parallel to the front panel), shown in FIGS. 4*a* and 4*b*, respectively. And the presence of Grounded conductive layers around the front panel area ensures that the entire front region occupied by the cables and the test fixture becomes surrounded by a ground signal when the front panel is closed.

While the invention has been described with reference to specific embodiments, the description is illustrative of the invention and is not to be construed as limiting the invention. Various modifications and applications may occur to those skilled in the art with out departing from the true spirit and scope of the invention as defined by the appended claims.

An appendix is attached. The appendix is a complete copy of the U.S. Provisional Patent Application to which the present application claims priority.

The invention claimed is:

1. A semiconductor device test apparatus to perform a high voltage test of a device under test (DUT), comprising:
    a plurality of source measurement units (SMUs);
    a plurality of SMU connectors, each SMU connector electrically connected to a corresponding separate one of the plurality of SMUs;
    a tester housing partially enclosing the plurality of SMUs and the plurality of SMU connectors; and
    a test fixture, the test fixture configured to be connected to the tester housing such that, in a closed state, the test fixture and the tester housing completely enclose the plurality of SMUs and the plurality of SMU connectors, wherein the test fixture includes
    a socket configured to receive pins of the DUT,
    a plurality of test fixture connectors, each test fixture connector corresponding to a separate pin of the DUT and configured to, via the socket and when connected by a cable to a corresponding separate one of the plurality of SMU connectors, provide a forcing signal from that test fixture connector to that separate pin of the DUT, receive a sensing signal from that separate pin of the DUT at that test fixture connector, and maintain a guard signal at that separate pin of the DUT at a same electrical potential as the forcing signal.

2. The test apparatus of claim 1, wherein:
    the test fixture includes a printed circuit board comprising a plurality of groups of traces, each group of traces corresponding to a separate one of the test fixture connectors and to a separate pin of the DUT and including at least one trace via which the forcing signal is provided from that separate one of the test fixture connectors to that separate pin of the DUT, at least one trace via which the sensing signal is received by that separate one of the test fixture connectors from that separate pin of the DUT, and at least one trace via which the guard signal fully encircles that separate pin of the DUT at a same electrical potential as the forcing signal.

3. The test apparatus of claim 1, wherein:
    each test fixture connector includes an internal connection configured such that, only when the cable corresponding to that test fixture connector is fully received to that connector, an outer metallic enclosure surrounding the plurality of wires of the cable is electrically connected to the at least one of the plurality of wires of the cable configured to carry the guard signal.

4. The test apparatus of claim 1, wherein:
    the SMU connectors and the test connectors are each configured to receive a min-USB cable.

5. The test apparatus of claim 1, further comprising:
    a dedicated DUT cover configured to cover the DUT.

6. A semiconductor device test apparatus to perform a high voltage test of a device under test (DUT), comprising:
    a plurality of source measurement units (SMUs);
    a plurality of cables, each cable electrically connected to a separate one of the plurality of SMUs;
    a tester housing partially enclosing the plurality of SMUs; and
    a test fixture, the test fixture configured to be connected to the tester housing such that, in a closed state, the test fixture and the tester housing completely enclose the plurality of SMUs, wherein the test fixture includes
    a socket configured to receive pins of the DUT,
    a plurality of test fixture connectors, each test fixture connector corresponding to a separate pin of the DUT and configured to, via the socket and when connected by the cable corresponding to a separate one of the plurality of SMUs, provide a forcing signal from that test fixture connector to that separate pin of the DUT, receive a sensing signal from that separate pin of the DUT at that test fixture connector, and maintain a guard signal at that separate pin of the DUT at a same electrical potential as the forcing signal.

7. The test apparatus of claim 6, wherein:
    the test fixture includes a printed circuit board comprising a plurality of groups of traces, each group of traces corresponding to a separate one of the test fixture connectors and to a separate pin of the DUT and including at least one trace via which the forcing signal is provided from that separate one of the test fixture connectors to that separate pin of the DUT, at least one trace via which the sensing signal is received by that separate one of the test fixture connectors from that separate pin of the DUT, and at least one trace via which the guard signal fully encircles that separate pin of the DUT at a same electrical potential as the forcing signal.

8. The test apparatus of claim 6, wherein:

each test fixture connector includes an internal connection configured such that, only when the cable corresponding to that test fixture connector is fully received to that connector, an outer metallic enclosure surrounding the plurality of wires of the cable is electrically connected to the at least one of the plurality of wires of the cable configured to carry the guard signal.

9. The test apparatus of claim 6, wherein:

each cable is a mini-USB cable separately connected to a corresponding SMU via an SMU connector; and the test connectors are each configured to receive a corresponding one of the min-USB cables.

10. The test apparatus of claim 6, further comprising:

a dedicated DUT cover configured to cover the DUT.

* * * * *